(12) United States Patent
Zolfaghari et al.

(10) Patent No.: US 8,476,911 B2
(45) Date of Patent: Jul. 2, 2013

(54) SYSTEM AND METHOD FOR ON-CHIP RESISTOR CALIBRATION IN SEMICONDUCTOR DEVICES

(75) Inventors: Alireza Zolfaghari, Laguna Niguel, CA (US); Chin-Ming Chien, Irvine, CA (US); Bojko Marholev, Lomma (SE)

(73) Assignee: Broadcom Corporation, Irvine, CA (US)

( * ) Notice: Subject to any disclaimer, the term of this patent is extended or adjusted under 35 U.S.C. 154(b) by 413 days.

(21) Appl. No.: 12/927,240

(22) Filed: Nov. 10, 2010

(65) Prior Publication Data

US 2012/0112773 A1    May 10, 2012

(51) Int. Cl.
*G01R 27/29* (2006.01)
*G01R 35/00* (2006.01)

(52) U.S. Cl.
USPC ........... 324/679; 324/601; 324/750.3; 257/48

(58) Field of Classification Search
None
See application file for complete search history.

(56) References Cited

U.S. PATENT DOCUMENTS 7,332,904 B1 * 2/2008 Menkus et al. ................. 257/48
2009/0140701 A1 * 6/2009 Raidl et al. ..................... 320/166

* cited by examiner

*Primary Examiner* — Minh N Tang
(74) *Attorney, Agent, or Firm* — Farjami & Farjami LLP

(57) ABSTRACT

According to one disclosed embodiment, an on-chip resistor calibration circuit includes an RC oscillator having a test resistor and a precision capacitor as elements, a counter, and a reference clock. In one embodiment, an RC oscillator generates a waveform having a period dependent upon the resistance of the test resistor and the capacitance of the precision capacitor. In such an embodiment, a counter and a reference clock may be configured to measure the period of the waveform. Using a pre-determined capacitance of the precision capacitor, a resistance of the test resistor may be determined. In another embodiment, an RC oscillator generates first and second waveforms through use of an additional capacitor that can be switched in and out of the RC oscillator circuit. Using a pre-determined capacitance of the precision capacitor, an RC product of the test resistor and the additional capacitor may be determined.

20 Claims, 4 Drawing Sheets

SYSTEM AND METHOD FOR ON-CHIP RESISTOR CALIBRATION IN SEMICONDUCTOR DEVICES

BACKGROUND OF THE INVENTION

1. Field of the Invention

The present invention is generally in the field of semiconductors. More particularly, the present invention is in the field of circuit element calibration.

2. Background Art

The proliferation of wireless communication devices has led to significant technological advances in the analog circuitry used in transceivers, converters, phase-locked loops and variable gain amplifiers, for example. Many of the advances have involved reducing the size, complexity and cost of each device, as well as reducing their power consumption. However, as the field has become more populated, precision in the manufacturing and operation of these devices has become increasingly important. For example, a cell phone transceiver must be capable of transmitting and receiving on precise channels within an available frequency band. In order to select specific channels, the cell phone must be able to precisely tune its transceiver so as to minimize cross talk with other transmissions.

In order to meet the requirements of low cost, low complexity and small size, many semiconductor manufactures choose to leverage conventional and relatively inexpensive fabrication technology, such as that used to form polysilicon resistors (polyresistors) in semiconductor devices, for example. But, as is known in the art, the actual resistance of a conventionally formed resistor can vary significantly from its desired resistance, from wafer to wafer and from process-run to process-run, increasingly as the size of a resistor is scaled down. Moreover, the actual resistance of a conventionally formed resistor can vary significantly with temperature. Fortunately, conventional resistors that are formed together on a single wafer often exhibit the same type of variance from their desired resistance. So, by measuring the resistance of one exemplary resistor on a single chip or die, one can calibrate all similarly fabricated resistors across a single-die semiconductor device, thereby providing the precision required by modern semiconductor devices.

Conventional calibration methods, which often require connections to off-chip devices, are typically expensive, complex, and time-consuming to implement. For example, one conventional method uses a relatively slow iterative process to match the resistance of an on-chip variable resistor block to that of an off-chip reference resistor. The external reference resistor can be relatively expensive to fabricate, and there is additional expense both in providing a precision via or pin on the semiconductor device for a precision analog electrical connection, as well as in providing sufficient mounting space and electrical noise shielding for the reference resistor.

Thus, there is a need to overcome the drawbacks and deficiencies in the art by providing a simplified, inexpensive, and more time-efficient system for calibrating resistors in semiconductor devices.

SUMMARY OF THE INVENTION

A system and method for on-chip resistor calibration in semiconductor devices, substantially as shown in and/or described in connection with at least one of the figures, as set forth more completely in the claims.

DETAILED DESCRIPTION OF THE INVENTION

Figure 1:
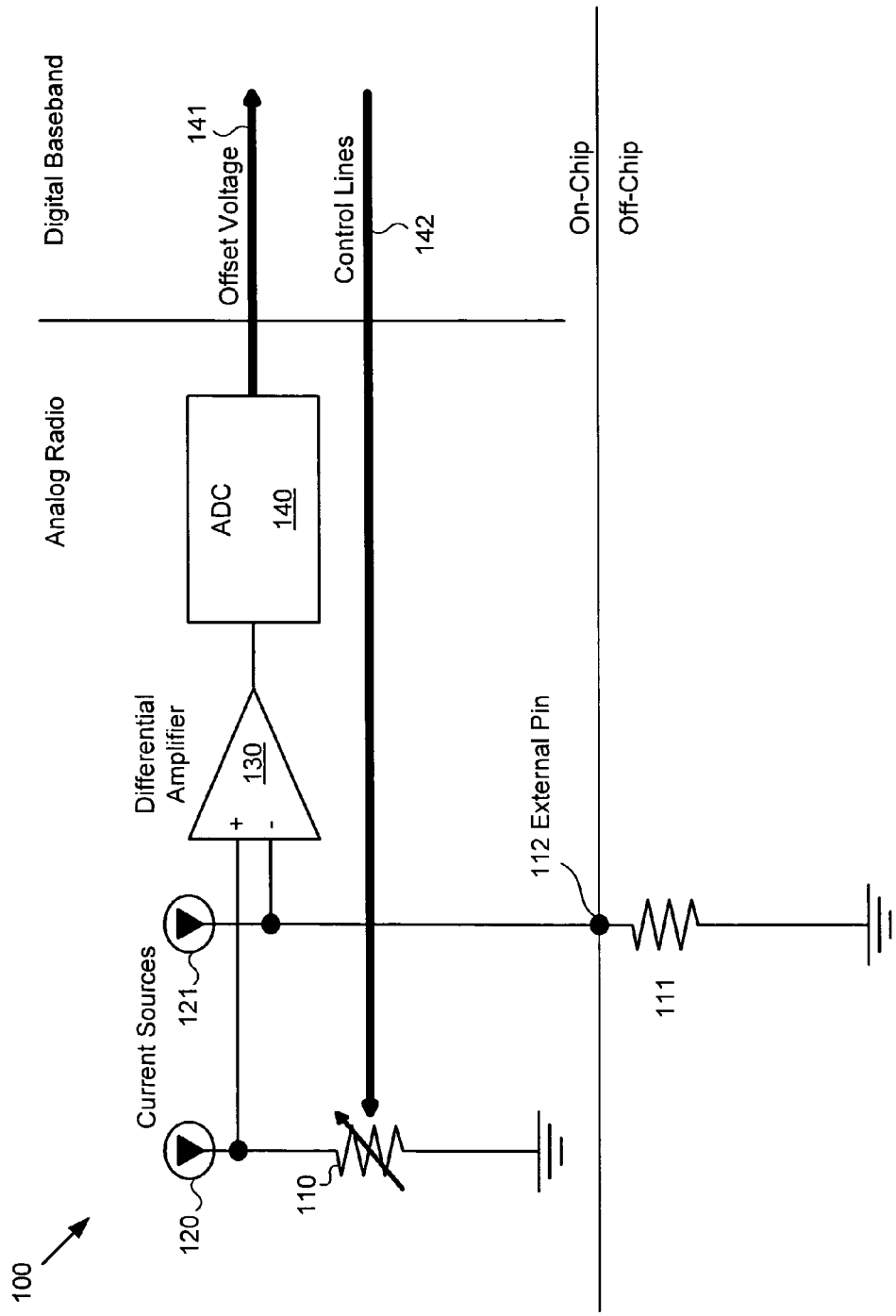
FIG. 1 illustrates an equivalent circuit schematic of a conventional technique for calibrating resistors.

The present invention is directed to a system and method for on-chip resistor calibration in semiconductor devices. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be understood that unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a conventional and relatively inefficient technique for calibrating resistors formed in a typical single-die transceiver. Conventional calibration system 100, in FIG. 1, is configured to calibrate variable resistor 110 by matching the resistance of variable resistor 110 to the known resistance of external reference resistor 111. As shown in FIG. 1, current sources 120 and 121 provide substantially the same current to variable resistor 110 and external reference resistor 111. The difference in voltages across the resistors (e.g., the offset voltage) is amplified and/or buffered, as desired, by differential amplifier 130 and then provided to analog-to-digital converter (ADC) 140. ADC 140 converts the offset voltage and delivers it to the digital portion of the transceiver (e.g., the Digital Baseband) over bus 141. Using the offset voltage as a guide, a control signal is provided over control lines 142 to variable resistor 110 to adjust its resistance and incrementally reduce the offset voltage, as fed back through differential amplifier 130 and ADC 140. By performing multiple iterations of the above steps, the offset voltage can be minimized and the resistance of variable resistor 110 can be made to substantially match the known resistance of external reference resistor 111. Using the control signal for a minimum offset voltage and the known resistance of external reference resistor 111, the resistance of variable resistor 110 may be derived, and all similarly fabricated resistors on the semiconductor die can be calibrated accordingly.

As can be seen from the above explanation, as well as from FIG. 1, this conventional technique requires the expense of forming external pin 112 and making a precision analog electrical connection to external reference resistor 111. Additionally, this conventional technique uses an iterative approach to match variable resistor 110 to external reference resistor 111, which takes a relatively lengthy period of time and, moreover, undesirably drains power resources during that time.

Figure 2:
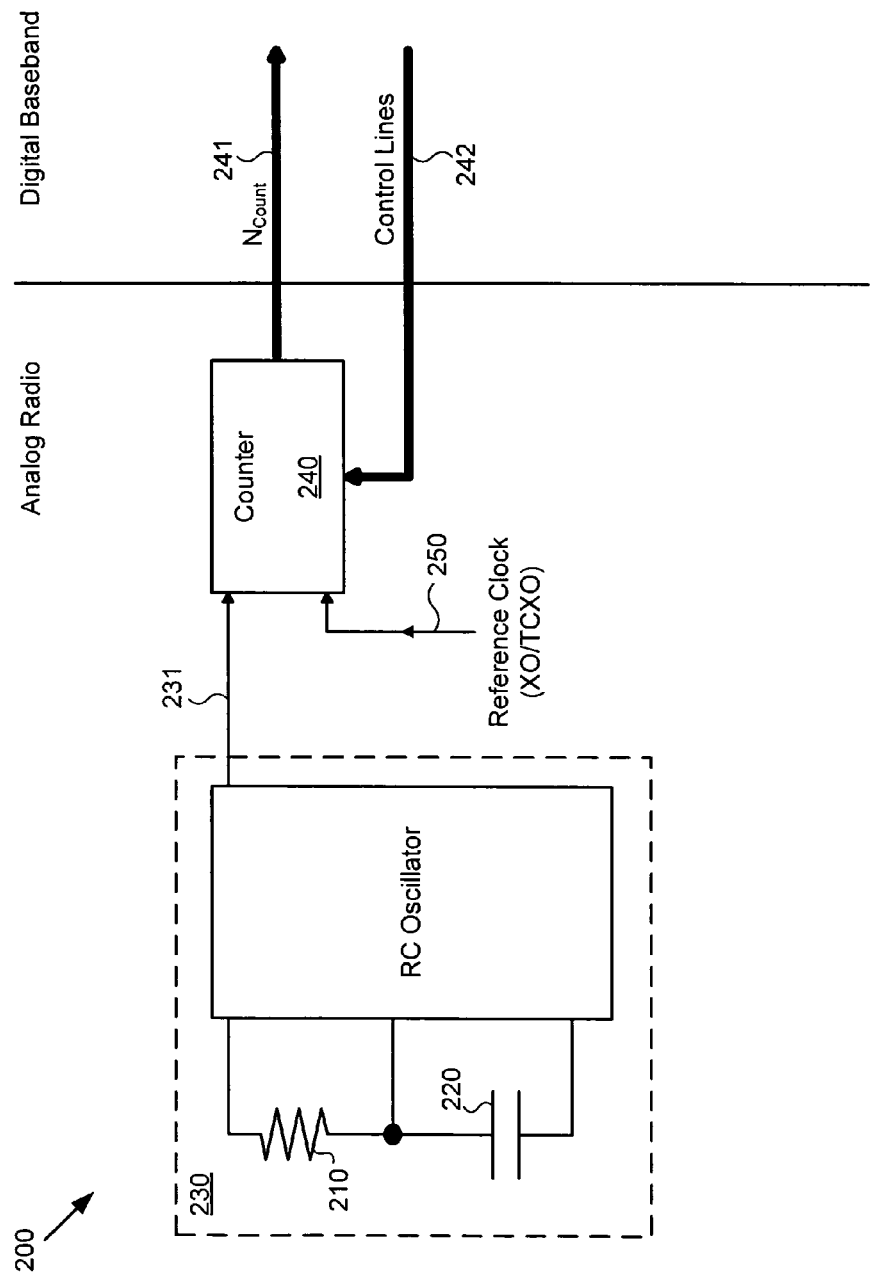
FIG. 2 illustrates a circuit schematic of an embodiment of the present invention.

FIG. 2 illustrates an embodiment of the present invention that obviates the inefficiencies inherent in using a conventional calibration technique such as the one depicted in FIG. 1. Calibration system 200, in FIG. 2, is configured to determine the resistance of test resistor 210 by measuring the period of waveform 231 generated by test resistor 210 in combination with other elements of a resistor-capacitor (RC) oscillator. Calibration system 200 may be formed on a portion of a semiconductor die as part of a single-die semiconductor transceiver, for example, and may comprise test resistor 210, precision capacitor 220, RC oscillator 230 including test resistor 210 and precision capacitor 220, and counter 240. As can be seen from FIG. 2, all analog portions of calibration system 200 may reside on-chip, thereby eliminating the need for a precision external analog connection. Furthermore, while reference clock 250 may be provided by a device residing off-chip, reference clock 250 may also be provided by a digital portion of the die (i.e., the Digital Baseband) so that no additional external connections are required.

Test resistor 210 may be an exemplary resistor or resistor network configured to facilitate calibration of similarly fabricated resistors on the same die. For example, test resistor 210 may have a desired resistance configured to be within a particular range of other resistors on the same die in order to simulate structural similarity, or may be configured to produce a waveform with a relatively long period in order to provide a higher precision calibration, as is explained more fully below. Test resistor 210 may comprise one or more polyresistors, for example, or may be any other type of resistor that can be fabricated on a semiconductor wafer or die.

Precision capacitor 220 may be any capacitor or capacitor network configured to have a pre-determined capacitance that varies very little from wafer to wafer, process-run to process-run, and over a wide temperature range. Additionally, precision capacitor 220 may be configured to have a pre-determined capacitance that varies very little with applied voltage. For example, precision capacitor 220 may comprise one or more metal-insulator-semiconductor (MIS) capacitors, such as metal-oxide-semiconductor (MOS) capacitors, as known in the art, and may be configured as one or more MIS varactors, as is also known in the art. An exemplary MOS varactor, for example, may exhibit a variation in its actual capacitance over different wafers, process-runs, temperatures and applied voltages that is less than 3% of its pre-determined capacitance.

RC oscillator 230 may be any oscillator circuitry that can be formed on a semiconductor wafer, for example, such that it can generate waveform 231 having a period that corresponds to, e.g., is substantially dependent upon, the resistance and capacitance of test resistor 210 and precision capacitor 220. For example, waveform 231 may have a period that is substantially proportional to a product of the resistance of test resistor 210 and the capacitance of precision capacitor 220. Although RC oscillator 230 is represented as having a specific configuration, that particular arrangement is not meant to limit the present inventive concepts. For example, although not explicitly shown in FIG. 2, RC oscillator 230 may be connected to a network of capacitors comprising precision capacitor 220 and to a resistor network comprising test resistor 210 such that either or both test resistor 210 or precision capacitor 220 are directly connected to ground. Moreover, and particularly if test resistor 210 and/or precision capacitor 220 are networks of resistors and capacitors, respectively, RC oscillator 230 may be configured to facilitate a particular RC oscillator topology, such as a topology producing a square-wave waveform, for example, or a topology producing a waveform with a relatively long period.

Counter 240 may be any circuitry that can be formed on a semiconductor wafer and be configured to measure a period of waveform 231 using reference clock 250. Reference clock 250 may be a signal generated from a conventional crystal oscillator (XO) or a temperature compensated crystal oscillator (TCXO), for example, or any other reference clock generator known in the art. As explained above, reference clock 250 may be provided by a digital portion of the same die on which RC oscillator 230 is implemented, such that no additional external connection is required. Additionally, reference clock 250 may be configured to have a frequency that is significantly higher than that of waveform 231 in order to facilitate accurate measurement of a period of waveform 231, as is explained more fully below.

As is known in the art, counter 240 may be configured to accept an initialization signal over control lines 242 which resets its count and places it in a waiting mode until it senses a signal edge or zero crossing, for example, of waveform 231. Upon sensing a signal edge or zero crossing, for example, counter 240 may then count the number of cycles of reference clock 250 until it senses some number of later signal edges or zero crossings of waveform 231. Once counter 240 has completed a count, counter 240 may deliver the count to the digital portion of the die (e.g., the Digital Baseband) over bus 241. As will be explained more fully below, the count may be used to determine the resistance of test resistor 210, thereby calibrating that type of resistor across the entire semiconductor die. Thus, the present invention is capable of calibrating resistors on a semiconductor die without the expense of an external connection and without the time and power needed for a conventional iterative technique.

Figure 3:
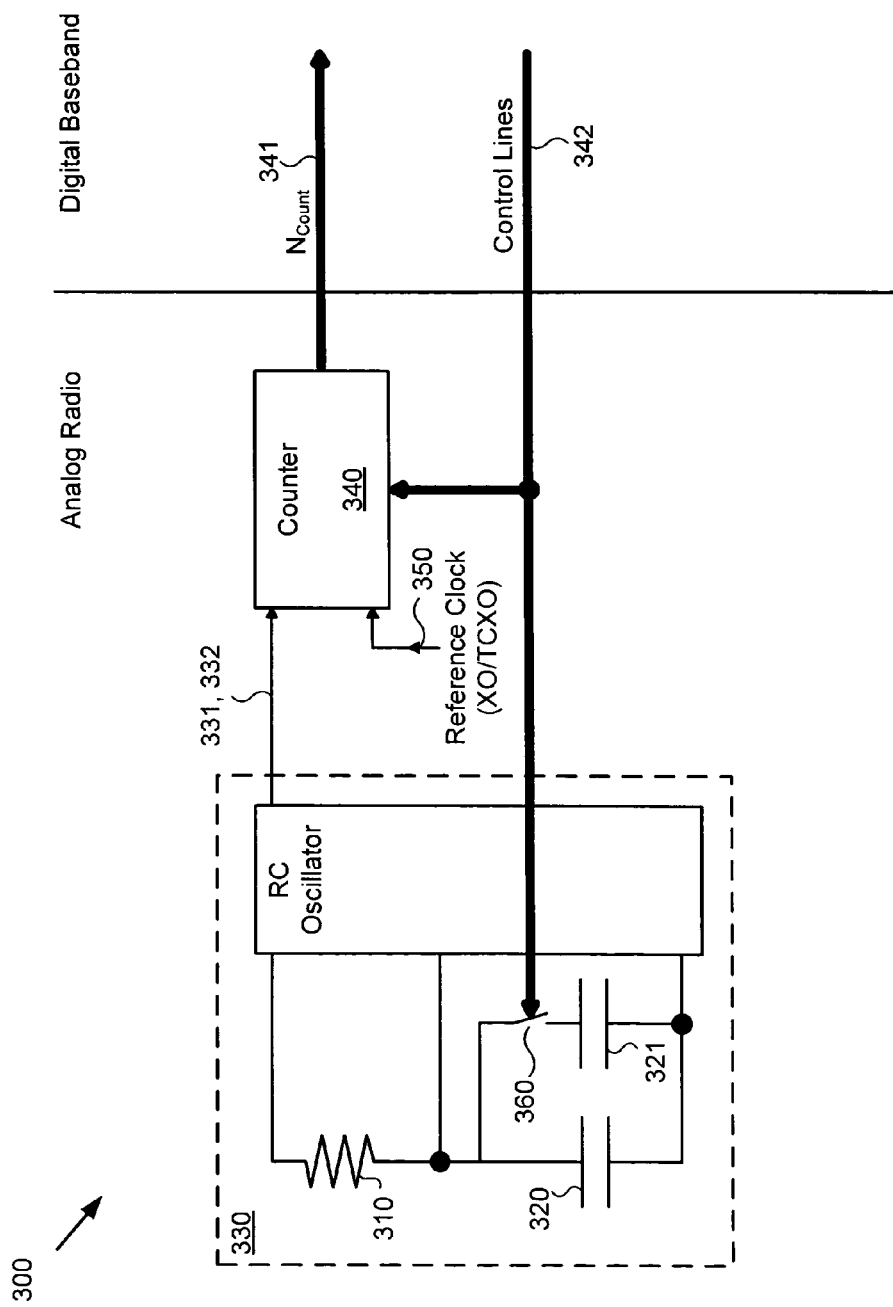
FIG. 3 illustrates a circuit schematic of another embodiment of the present invention.

Turning to FIG. 3, FIG. 3 illustrates an embodiment of the present invention that may be used for on-chip calibration of additional circuit elements fabricated on a semiconductor die. FIG. 3 shows calibration system 300 configured to determine the product of the resistance of test resistor 310 and the capacitance of capacitor 321 (e.g., an RC product). It is noted that test resistor 310, precision capacitor 320, RC oscillator 330, counter 340, bus 341, control lines 342 and reference clock 350 correspond, respectively, to test resistor 210, precision capacitor 220, RC oscillator 230, counter 240, buss 241, control lines 242 and reference clock 250 as discussed with respect to FIG. 2 above, and each corresponding element may be configured to exhibit the same features and/or operate substantially the same as its counterpart. In addition, calibration system 300 includes capacitor 321 and switch 360, where switch 360 may be used to isolate capacitor 321 from the rest of calibration system 300. As explained more fully below, waveform 331 may be generated when switch 360 is open, and waveform 332 may be generated when switch 360 is closed.

Capacitor 321 may be an exemplary capacitor or capacitor network configured to facilitate calibration of similarly fabricated capacitors and RC circuits on the same die. For example, capacitor 321 may have a pre-determined capacitance configured to be within a particular range of other capacitors on the same die in order to simulate structural similarity, or may be configured to produce a waveform 332, when connected to test resistor 310 and precision capacitor 320, with a relatively long period in order to provide a higher precision calibration. Capacitor 321 may comprise one or more metal capacitors, for example, or may be any other type of capacitor that can be fabricated on a semiconductor wafer. As is known in the art, the actual capacitance of a particular metal capacitor may vary from its pre-determined capacitance from wafer to wafer, process-run to process-run, and from temperature to temperature, much like a conventional resistor, as explained above.

Switch 360 may be any semiconductor switch that can be formed on a semiconductor wafer and configured to isolate capacitor 321 from calibration system 300 according to a control signal provided over control lines 342, such that switch 360 and RC oscillator 330 can generate first and second waveforms 331 and 332 with first and second periods corresponding to, e.g., substantially dependant upon, the resistance of test resistor 310, the capacitance of precision capacitor 320, and, depending on the status of switch 360, the capacitance of capacitor 321.

As with RC oscillator 230 above, although RC oscillator 330 is shown in FIG. 3 as including test resistor 310, capacitor 320, switch 360 and capacitor 321 according to a specific configuration, the particular arrangement is not meant to limit the present inventive concepts. For example, although not explicitly shown in FIG. 3, RC oscillator 330 may connect to each of test resistor 310, precision capacitor 320 and capacitor 321 over multiple signal paths in order to facilitate a particular RC oscillator topology, such as a topology producing square-wave waveforms, for example, or a topology producing first and second waveforms with highly differentiated periods.

Counter 340, using a technique similar to the one used by counter 240 in FIG. 2 above, can be configured to provide first and second counts corresponding to first and second periods of first and second waveforms 331 and 332, as generated by RC oscillator 330 using switch 360, to the digital portion of the die over bus 341. As will be explained more fully below, the first and second counts may be used to determine an RC product of test resistor 310 and capacitor 321, thereby calibrating that product for similarly fabricated structures across the semiconductor die. In addition, also explained below, the first and second counts may also be used to determine the resistance of test resistor 310 and the capacitance of capacitor 321, thereby calibrating that type of resistor and that type of capacitor for the entire semiconductor die. Thus, the present invention is capable of calibrating resistors, RC products and capacitors in a single-die semiconductor device with only a minimal addition of circuitry over that required by the present inventive concepts for calibrating resistors alone.

Figure 4:
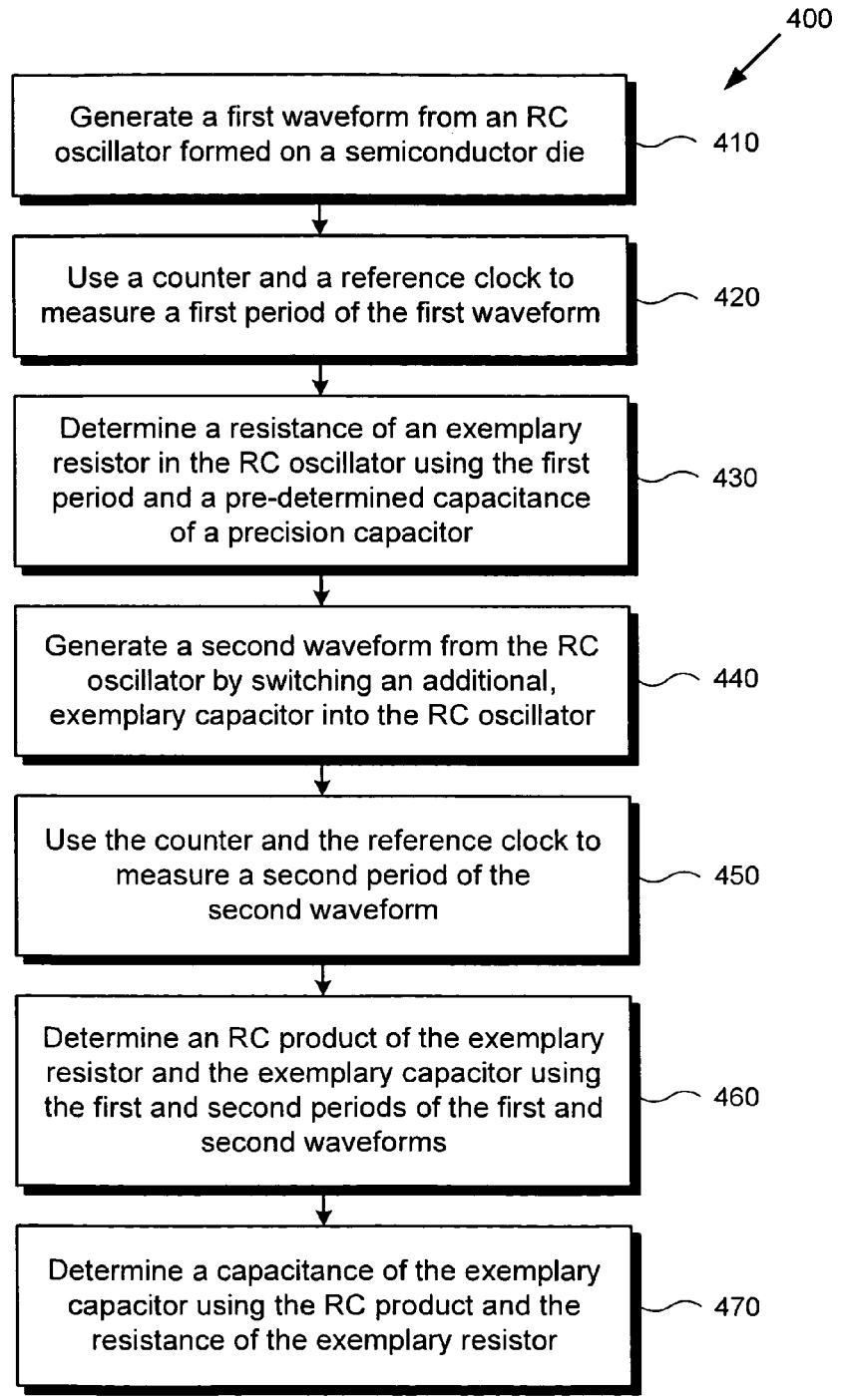
FIG. 4 shows a flowchart illustrating steps taken to implement a method for on-chip calibration of a circuit element, according to an embodiment of the present invention.

Turning to FIG. 4, FIG. 4 shows flowchart 400a illustrating a method for on-chip calibration of a resistor, an RC product, and a capacitor according to an embodiment of the present invention. Certain details and features have been left out of flowchart 400a that are apparent to a person of ordinary skill in the art. For example, a step may consist of one or more substeps or may involve specialized equipment or materials, as known in the art. Steps 410 through 470 indicated in flowchart 400a are sufficient to describe one embodiment of the present invention; however, other embodiments of the invention may make use of steps different from those shown in flowchart 400a. It is noted that FIG. 3 illustrates a system capable of performing the method of flowchart 400a, and so steps 410 through 470 are described with reference to calibration system 300 in FIG. 3.

Referring now to step 410 of the method embodied in FIG. 4, step 410 of flowchart 400a comprises generating a first waveform from an RC oscillator formed on a semiconductor die. As shown in FIG. 3, first waveform 331 may be generated from RC oscillator 330 by using a control signal over control lines 342 to open switch 360 and isolate capacitor 321 from the rest of the circuit. A signal on control lines 342 may be generated by a digital portion of a semiconductor die, for example, when a calibration is desired, such as when a temperature change is detected, or periodically throughout operation of the semiconductor device.

Continuing with step 420 in FIG. 4, step 420 of flowchart 400a comprises using a counter and a reference clock to measure a first period of the first waveform generated in step 410. As explained above with reference to FIG. 3, counter 340 may measure a first period of first waveform 331 by counting a number of cycles of reference clock 350 between, for example, some number of signal edges or zero crossings of first waveform 331. Counter 340 may then forward the count to the digital portion of the semiconductor device for further processing. As noted above, counter 340 may begin measuring a first period when initialized by control lines 342, for example, such as when a calibration is desired. As is known in the art, the precision of the measure of the first period of first waveform 331 can be increased by increasing the frequency of reference clock 350 and/or by increasing the number of signal edges or zero crossings of first waveform 331 sensed by counter 340 before completing its count, for example. The total number of signal edges or zero crossings for a particular count may be controlled, for example, through use of control signals over control lines 342.

Referring now to step 430 in FIG. 4, step 430 of flowchart 400a comprises determining a resistance of an exemplary resistor in the RC oscillator using the first period of the first waveform and a pre-determined capacitance of a precision capacitor. As is known in the art, the period of an RC oscillator may be mathematically dependent on the resistance of a constituent resistor (e.g., test resistor 310) multiplied by the capacitance of a constituent capacitor (e.g., precision capacitor 320). As a result, the resistance of test resistor 310 may be determined with relatively high precision using the first period of first waveform 331, as provided by counter 340 in step 420, and the pre-determined capacitance of precision capacitor 320. Once the resistance of test resistor 310 is known, all similarly fabricated resistors residing on the same semiconductor wafer may be calibrated accordingly. Thus, the present invention can provide an entirely on-chip resistor calibration for a semiconductor device, allowing conventional fabrication techniques to be used in high precision applications.

Moving now to step 440 in FIG. 4, step 440 of flowchart 400a comprises generating a second waveform from the RC oscillator of steps 410 through 430 by switching an exemplary capacitor into the RC oscillator circuit. As shown in FIG. 3, second waveform 332 may be generated from RC oscillator 330 by using control lines 342 and switch 360 to connect capacitor 321 into the circuit. As explained above with reference to step 410, a signal on control lines 342 may be generated by a digital portion of a semiconductor device as part of a calibration process when a calibration is desired.

Next, step 450 in FIG. 4 comprises using the counter and reference clock of step 420 to measure a second period of the second waveform generated in step 440. Similar to step 420 described above, counter 340 may measure and then forward the measure of the second period to the digital portion of the semiconductor device for further processing.

Continuing with step 460 in FIG. 4, step 460 of flowchart 400a comprises determining an RC product of the exemplary resistor and exemplary capacitor using the first and second periods of the first and second waveforms. As explained above, the period of an RC oscillator may be dependent on the product of the resistance of a constituent resistor and the capacitance of a constituent capacitor (e.g., the RC product). When switch 360 in FIG. 3 is closed and capacitor 321 is connected to precision capacitor 320 and test resistor 310, as shown in FIG. 3, the resistance of the circuit is the resistance of test resistor 310, but the capacitance of the circuit is the capacitance of precision capacitor 320 added to the capacitance of capacitor 321, as is known in the art. Consequently, the second period of the second waveform is dependent on the resistance of test resistor 310 multiplied by the sum of the capacitances of precision capacitor 320 and capacitor 321. As a result, the RC product of test resistor 310 and capacitor 321 can be determined with relatively high precision by subtracting the second period from the first period. Once the RC product of the test resistor 310 and capacitor 321 is known, all similarly fabricated RC circuits on the same semiconductor device may be calibrated accordingly. Thus, the present invention can provide an entirely on-chip RC product calibration for a semiconductor device, allowing conventional fabrication techniques to be used in high precision applications. Furthermore, the present invention can do so with only minimal additional circuitry over that required by the present inventive concepts to calibrate resistors on the same device.

Finally, step 470 in flowchart 400a comprises determining a capacitance of the exemplary capacitor using the RC product and the resistance of the exemplary resistor. Once the RC product of test resistor 310 and capacitor 321 has been determined, such as in step 460, for example, the capacitance of capacitor 321 can be calculated with relatively high precision using the actual resistance of test resistor 310 as provided, for example, in step 430. As before, once the capacitance of capacitor 321 is known, then all similarly fabricated capacitors residing on the same semiconductor device may be calibrated accordingly. Thus, the present invention can provide an entirely on-chip capacitor calibration for a semiconductor device, allowing conventional fabrication techniques to be used in high precision applications. Furthermore, the present invention can do so with only minimal additional circuitry over that required to calibrate resistors on the same device, and with no additional circuitry over that required to calibrate an RC product for RC circuits on the same device.

Thus, because the present system and method can provide a resistor calibration without the need for an external connection, the cost and complexity of resistor calibration is significantly reduced as compared to conventional techniques. Furthermore, because the present method does not require an iterative process, a resistor calibration may be determined in a shorter time and using less power than conventional methods, which allows the calibration to be performed more often, thereby providing a more precise calibration over, for example, varying temperatures. As such, semiconductor devices utilizing the present inventive concepts may leverage conventional and inexpensive fabrication techniques to implement technology requiring higher precision and less power than can be provided by conventional means.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A system for on-chip resistor calibration in a semiconductor device, said system comprising:
    a resistor-capacitor (RC) oscillator implemented on a semiconductor die, said RC oscillator including a test resistor and a precision capacitor having a pre-determined capacitance;
    a counter fabricated on said semiconductor die, said counter configured to receive a reference clock and an output provided by said RC oscillator as first and second inputs;
    said system configured to determine a resistance of said test resistor using said first and second inputs to said counter.

2. The system of claim 1, wherein said output of said RC oscillator comprises a period substantially proportional to a product of said resistance and said pre-determined capacitance.

3. The system of claim 1, wherein said precision capacitor comprises a metal-insulator-semiconductor (MIS) capacitor.

4. The system of claim 1, wherein said precision capacitor comprises a MIS varactor.

5. The system of claim 1, wherein said precision capacitor comprises a metal-oxide-semiconductor (MOS) varactor.

6. The system of claim 1, wherein said test resistor comprises a polysilicon resistor.

7. The system of claim 1, further comprising another capacitor coupled into said RC oscillator by a switch.

8. The system of claim 7, wherein said another capacitor comprises a metal capacitor.

9. The system of claim 7, wherein said system is configured to determine an RC product of said test resistor and said another capacitor.

10. The system of claim 9, wherein said RC product is combined with said resistance to determine a capacitance of said another capacitor.

11. The system of claim 1, wherein said counter is configured to use said reference clock to measure a first period of a first waveform provided by said RC oscillator as said output, said first period being combined with said pre-determined capacitance to determine said resistance.

12. The system of claim 11, further comprising another capacitor coupled to said RC oscillator by a switch;
    said RC oscillator providing a second waveform to said counter while said another capacitor is connected to said RC oscillator;
    said counter being configured to use said reference clock to measure a second period of said second waveform, said second period being combined with said first period to determine an RC product of said test resistor and said another capacitor.

13. A method for on-chip resistor calibration in a semiconductor device, said method comprising:
    generating an output by a resistor-capacitor (RC) oscillator implemented on a semiconductor die, said output corresponding to a test resistor and a precision capacitor of said RC oscillator, said precision capacitor having a pre-determined capacitance;
    receiving said output and a reference clock as first and second inputs by a counter fabricated on said semiconductor die;
    determining a resistance of said test resistor using said first and second inputs.

14. The method of claim 13, wherein said output of said RC oscillator comprises a period substantially proportional to a product of said resistance and said pre-determined capacitance.

15. The method of claim 13, wherein said precision capacitor comprises a metal-insulator-semiconductor (MIS) capacitor.

16. The method of claim 13, wherein said precision capacitor comprises a MIS varactor.

17. The method of claim 13, wherein said precision capacitor comprises a metal-oxide-semiconductor (MOS) varactor.

18. The method of claim 13, further comprising:
   coupling another capacitor into said RC oscillator by a switch; and
   determining an RC product of said test resistor and said another capacitor.

19. The method of claim 18, further comprising using said RC product and said resistance to determine a capacitance of said another capacitor.

20. The method of claim 18, wherein said another capacitor comprises a metal capacitor.

* * * * *